United States Patent
Ohba (10) Patent No.: US 7,176,479 B2
(45) Date of Patent: Feb. 13, 2007

(54) NITRIDE COMPOUND SEMICONDUCTOR ELEMENT

(75) Inventor: Yasuo Ohba, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/773,297

(22) Filed: Feb. 9, 2004

(65) Prior Publication Data

US 2004/0155250 A1    Aug. 12, 2004

Related U.S. Application Data

(63) Continuation of application No. 10/188,744, filed on Jul. 5, 2002, now abandoned.

(30) Foreign Application Priority Data

Jul. 6, 2001    (JP)    ............... 2001-206144

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. ............ 257/12; 257/11; 257/14; 257/15; 257/20; 257/24; 257/51; 257/66; 257/67; 257/69; 257/70; 257/75; 257/94; 257/96; 257/97; 257/101; 257/102; 257/103; 257/184; 257/189; 257/615

(58) Field of Classification Search ............ 257/11–12, 257/14–15, 20, 24, 51, 66–67, 69, 70, 75, 257/96–97, 101–103, 94, 184, 189, 615
See application file for complete search history.

(56) References Cited

U.S. PATENT DOCUMENTS

| | | | |
|---|---|---|---|
| 4,792,958 A | 12/1988 | Ohba et al. | 372/45.01 |
| 4,809,287 A | 2/1989 | Ohba et al. | 372/45.01 |
| 4,835,117 A | 5/1989 | Ohba et al. | 438/40 |
| 4,893,313 A | 1/1990 | Hatakoshi et al. | 372/46.01 |
| 4,910,743 A | 3/1990 | Ohba et al. | 372/45.01 |
| 4,928,285 A | 5/1990 | Kushibe et al. | 372/45.01 |
| 4,949,349 A | 8/1990 | Ohba et al. | 372/45.01 |
| 5,005,057 A | 4/1991 | Izumiya et al. | 257/13 |
| 5,036,521 A | 7/1991 | Hatakoshi et al. | 372/45.01 |
| 5,042,043 A | 8/1991 | Hatano et al. | 372/45.012 |
| 5,076,800 A | 12/1991 | Milnes et al. | 439/394 |

(Continued)

FOREIGN PATENT DOCUMENTS

JP    07/235692    9/1995

(Continued)

*Primary Examiner*—Ida M. Soward
(74) *Attorney, Agent, or Firm*—Oblon, Spivak, McClelland, Maier & Neustadt, P.C.

(57) ABSTRACT

A nitride compound semiconductor element having improved characteristics, productivity and yield. A nitride compound semiconductor element includes: a sapphire substrate; a first single crystalline layer of AlN formed on said sapphire substrate; a second single crystalline layer formed on said first single crystalline layer, said second single crystalline layer being made of $Al_xGa_{1-x}N$ ($0.8 \leq x \leq 0.97$) and having a thickness of equal to or more than 0.3 μm and equal to or less than 6 μm; and a device structure section of a nitride semiconductor formed on said second single crystalline layer.

13 Claims, 8 Drawing Sheets

U.S. PATENT DOCUMENTS

| | | | |
|---|---|---|---|
| 5,079,184 A | 1/1992 | Hatano et al. | 117/102 |
| 5,103,271 A | 4/1992 | Izumiya et al. | 257/94 |
| 5,146,465 A * | 9/1992 | Khan et al. | 372/45 |
| 5,168,077 A | 12/1992 | Ashizawa et al. | 117/102 |
| 5,228,044 A | 7/1993 | Ohba | 372/45.01 |
| 5,235,194 A | 8/1993 | Izumiya et al. | 257/13 |
| 5,273,933 A | 12/1993 | Hatano et al. | 117/89 |
| 5,317,167 A | 5/1994 | Izumiya et al. | 257/93 |
| 5,432,808 A | 7/1995 | Hatano et al. | 372/45.01 |
| 5,617,438 A | 4/1997 | Hatano et al. | 372/45.01 |
| 5,656,832 A | 8/1997 | Ohba et al. | 257/190 |
| 5,665,467 A * | 9/1997 | Nakayama et al. | 428/332 |
| 5,679,965 A * | 10/1997 | Schetzina | 257/103 |
| 5,693,963 A * | 12/1997 | Fujimoto et al. | 257/94 |
| 5,740,192 A | 4/1998 | Hatano et al. | 372/45.01 |
| 5,875,052 A | 2/1999 | Shmagin et al. | 359/244 |
| 5,909,040 A | 6/1999 | Ohba et al. | 257/190 |
| 5,915,164 A * | 6/1999 | Taskar et al. | 438/47 |
| 5,923,058 A | 7/1999 | Agarwal et al. | 257/198 |
| 5,923,953 A * | 7/1999 | Goldenberg Barany et al. | 438/93 |
| 5,929,466 A | 7/1999 | Ohba et al. | 257/103 |
| 5,929,467 A | 7/1999 | Kawai et al. | 257/192 |
| 5,990,495 A | 11/1999 | Ohba | 257/94 |
| 5,998,810 A * | 12/1999 | Hatano et al. | 257/102 |
| 6,046,464 A | 4/2000 | Schetzina | 257/96 |
| 6,165,812 A * | 12/2000 | Ishibashi et al. | 438/46 |
| 6,218,293 B1 * | 4/2001 | Kraus et al. | 438/644 |
| 6,242,764 B1 | 6/2001 | Ohba et al. | 257/190 |
| 6,259,122 B1 * | 7/2001 | Ota et al. | 257/101 |
| 6,281,522 B1 * | 8/2001 | Ishibashi et al. | 257/77 |
| 6,306,672 B1 | 10/2001 | Kim | 438/22 |
| 6,440,823 B1 | 8/2002 | Vaudo et al. | 438/478 |
| 6,541,798 B2 * | 4/2003 | Koike et al. | 257/94 |
| 6,555,846 B1 * | 4/2003 | Watanabe et al. | 257/94 |
| 6,607,595 B1 * | 8/2003 | Manabe et al. | 117/88 |
| 6,661,822 B1 * | 12/2003 | Kubota et al. | 372/46 |
| 6,680,957 B1 * | 1/2004 | Koike et al. | 372/43.01 |
| 2001/0010941 A1 * | 8/2001 | Morita | 438/46 |
| 2001/0038656 A1 * | 11/2001 | Takeuchi et al. | 372/45 |
| 2001/0048114 A1 * | 12/2001 | Morita et al. | 257/103 |
| 2001/0055871 A1 * | 12/2001 | Takeya et al. | 438/604 |
| 2002/0001864 A1 * | 1/2002 | Ishikawa et al. | 438/22 |
| 2002/0013042 A1 * | 1/2002 | Morkoc | 438/604 |
| 2002/0014629 A1 * | 2/2002 | Shibata et al. | 257/79 |
| 2002/0060326 A1 * | 5/2002 | Manabe et al. | 257/103 |
| 2003/0109076 A1 * | 6/2003 | Senda et al. | 438/46 |

FOREIGN PATENT DOCUMENTS

| | | |
|---|---|---|
| JP | 2000-31588 | 1/2000 |
| JP | 2000-031588 | 1/2000 |

* cited by examiner

NITRIDE COMPOUND SEMICONDUCTOR ELEMENT

CROSS-REFERENCE TO RELATED APPLICATIONS

This application is based upon and claims the benefit of priority from the prior Japanese Patent Application No. 2001-206144, filed on Jul. 6, 2001, the entire mole fractions of which are incorporated herein by reference.

BACKGROUND OF THE INVENTION

1. Field of the Invention

The present invention relates generally to a nitride compound semiconductor element.

2. Related Background Art

GaN, which is one of compound semiconductors of Groups III–V containing nitrogen, has a large band gap of 3.4 eV and is direct gap semiconductor. So, there has been grate interest in nitride compound semiconductor as a material of a short-wavelength light emitting element. Also, there has been grate interest in nitride compound semiconductor as a high output electronic element material that needs a high insulating strength because of its large band gap. In the past, it was considered that the crystal growth of GaN was difficult because there were no good substrates that coincided in lattice constant and thermal expansion coefficient with GaN. However, a method of growing GaN crystals on a sapphire substrate having a lattice mismatch of 15% with GaN has then been developed, using a low-temperature buffer layer. According to this method, a thin amorphous or polycrystal AlN or GaN film is grown as a buffer layer on the sapphire substrate at a low temperature of about 600° C. to modify the effect of the lattice mismatch and then an device structure section of GaN is grown on the buffer layer at a high temperature of about 1000° C. This method provides a layered structure of nitride semiconductors containing GaN formed on the sapphire substrate to thereby realize a nitride compound semiconductor element such as a blue-light emitting diode and/or a royal purple-light emitting laser.

With the conventional nitride compound semiconductor elements, however, the sapphire substrate is prone to be warped to thereby lower productivity and/or yield. It has been considered that this warp cannot be avoided as long as the sapphire substrate is used that is different scores of % in coefficient of thermal expansion from the nitride semiconductor.

More particularly, with the conventional GaN crystal growth, the sapphire substrate was warped at its midline so as to be convex toward the nitride semiconductor because large residual stresses were produced in the GaN. It has been considered in the conventional technical commonsense that the large residual stresses are produced necessarily due to a difference in coefficient of thermal expansion between the sapphire substrate and the nitride semiconductor layer and can not be avoided. The production of the residual stresses in GaN is prone to produce threading dislocations and/or cracks in the GaN. Especially, when the substrate is large, the threading dislocations and/or cracks become remarkable. Thus, it has been considered in the past that crystal growth for a nitride compound semiconductor element on a large substrate is extremely difficult and that a deterioration in the productivity and/or yield cannot be avoided compared to semiconductor elements of other materials.

The inventor considers that no satisfactory characteristics are obtained due to the above-mentioned large residual stresses in the prior art nitride compound semiconductor elements. The inventor, however, considers that nitride compound semiconductor elements having improved characteristics compared to the prior art will be obtained by reducing the large residual stresses, other unnecessary stresses and crystal defects such as the threading dislocations.

SUMMERY OF THE INVENTION

The present invention has been made based on the recognition of such problems. It is an object of the present invention to provide nitride compound semiconductor elements having high characteristics and improved in productivity and/or yield.

According to embodiments of the present invention, there is provided A nitride compound semiconductor element comprising:

a sapphire substrate;

a first single crystalline layer of AlN formed on said sapphire substrate;

a second single crystalline layer formed on said first single crystalline layer, said second single crystalline layer being made of $Al_xGa_{1-x}N (0.8 \leq x \leq 0.97)$ and having a thickness of equal to or more than 0.3 μm and equal to or less than 6 μm; and a device structure section of a nitride compound semiconductor formed on said second single crystalline layer.

According to embodiments of the present invention, there is further provided a nitride compound semiconductor element comprising:

a sapphire substrate;

a first single crystalline layer of AlN formed on said sapphire substrate;

a lattice modification layer formed on said first single crystalline layer, said lattice modification layer being made of $Al_yGa_{1-y}N (0.25 \leq y \leq 0.75)$ and having a thickness of equal to or more than 0.3 μm and equal to or less than 3 μm; and a device structure section of a nitride compound semiconductor formed on said lattice modification layer.

According to embodiments of the present invention, there is provided a nitride compound semiconductor element comprising:

a first single crystalline layer of AlN formed on said sapphire substrate;

a second single crystalline layer formed on said first single crystalline layer, said second single crystalline layer being made of $Al_xGa_{1-x}N (0.8 \leq y \leq 1)$; and a FET device structure section formed on said second single crystalline layer, said FET device structure section having a channel layer, a source electrode electrically connected to said channel layer, a drain electrode electrically connected to said channel layer, and a gate electrode formed over a first part of said channel layer via a gate insulating film made of $Al_{1-b}In_bN (0.03 \leq b \leq 0.10)$.

DETAILED DESCRIPTION OF THE INVENTION

Before giving a detailed description of the embodiments according to the present invention, results of the inventor's unique experiments on which the present invention is based will be described with reference to FIG. 1.

Figure 1:
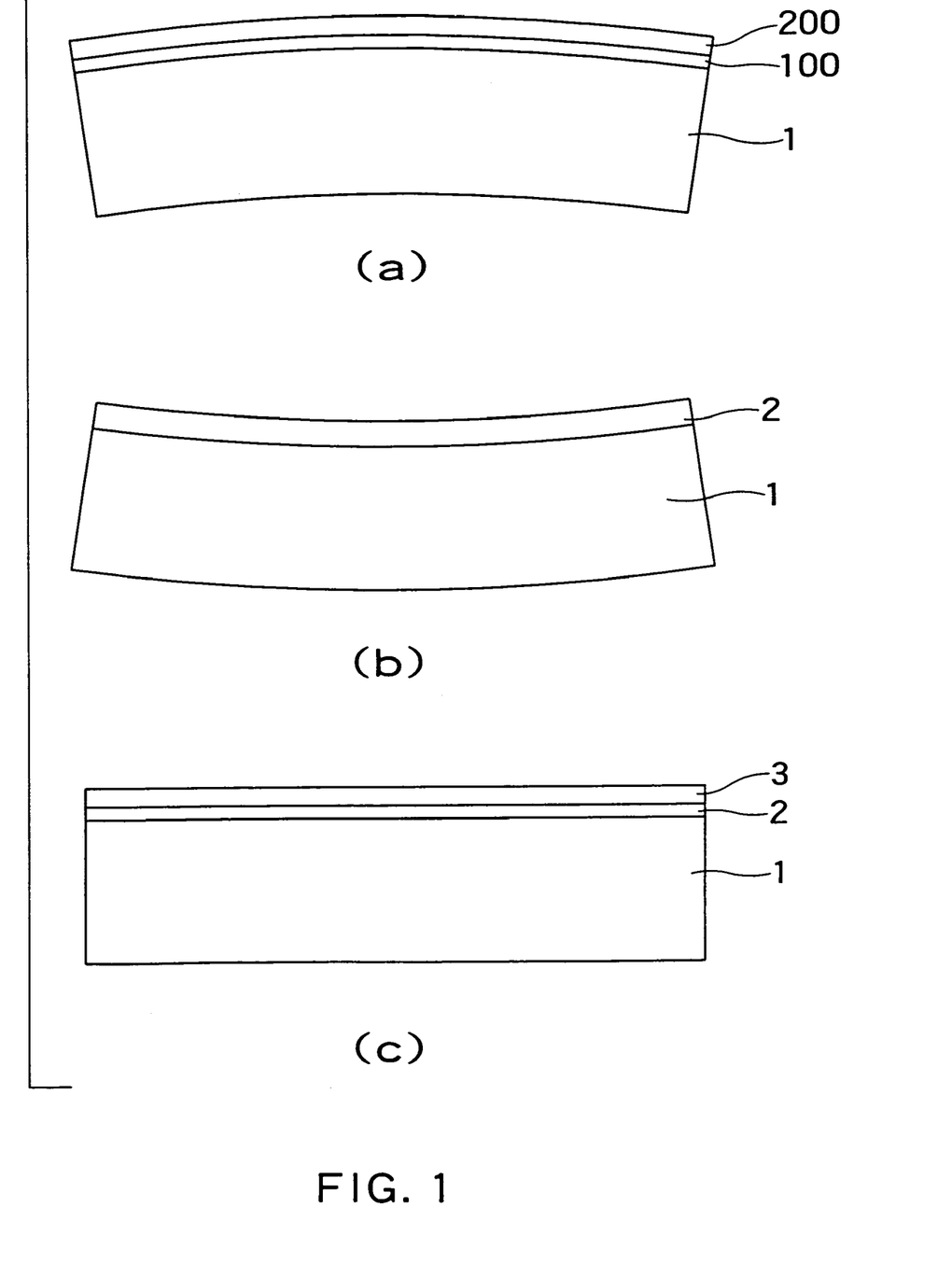
FIG. 1 illustrates results of the inventor's experiments on which the present invention is based.

FIGS. 1(*a*)–(*c*) each show a sapphire substrate 1 having a thickness of about 300 μm and a diameter of 2 inches (about 5 cm), on which a nitride compound semiconductor layer having a thickness of about 1 μm is formed. For convenience of explanation, the thicknesses and widths of the respective layers are drawn on appropriately different scales.

As shown in FIG. 1(*a*), when a nitride compound semiconductor layer is formed on the sapphire substrate 1 in the prior art, a low-temperature buffer layer 100 is formed on sapphire substrate 1 at a low temperature of about 600° C., and a nitride semiconductor layer 200 is then formed on the buffer layer 100 at a high temperature of about 1000° C. It is known in this method that the sapphire substrate is greatly warped so as to be convex toward the nitride semiconductor 200. This convex warp is considered to be due to a difference in coefficient of thermal expansion between the sapphire substrate 1 and the semiconductor layer 200, which was considered to be unavoidable in the prior-art technical commonsense.

The inventor, however, find uniquely that formation of an AlN single crystalline layer 2 instead of the conventional low-temperature buffer layer 100 on the sapphire substrate 1, as shown in FIG. 1(*b*), causes the sapphire substrate 1 to be warped so as to be concave toward the AlN single crystalline layer 2, contrary to the prior-art commonsense. Based on these results, the inventor consider than when the AlN single crystalline layer 2 is formed on the sapphire substrate 1 and a layer having a lattice constant larger than the AlN single crystalline layer 2 is formed on the AlN single crystalline layer 2, stresses would be modified and the warp would disappear.

As shown in FIG. 1(*c*), the inventor form an AlGaN single crystalline layer 3 having a larger lattice constant than AlN single crystalline layer 2 on AlN single crystalline layer 2, and conduct experiments by selecting various Ga mole fraction percentages and thicknesses of the AlGaN single crystalline layer. As a result, the inventor find that when an AlGaN single crystalline layer 3 having a lattice constant slightly larger than AlN, an Al mole fraction in a range of 0.8 through 0.97, and a thickness in a range of 0.3 through 6 μm is formed on the AlN single crystalline layer 2, the warping of sapphire substrate 1 and stresses in the AlGaN single crystalline layer 3 diminish. According to the inventor's experiments, it is found that when the AlGaN single crystalline layer 3 has a thickness of less than 0.3 μm, the AlGaN single crystalline layer is not flattened sufficiently whereas when the single crystalline layer 3 has a thickness of more than 6 μm, cracks are produced in the AlGan single crystalline layer 3.

Also, according to the inventor's experiments, when an AlGaN single crystalline layer 3 having an Al mole fraction in a range of 0.85 through 0.95 and a thickness in a range of 0.7 through 3 μm is used, more preferable results are obtained. That is, when the Al mole fraction is in that range just mentioned above, the stresses are further reduced. When the thickness of the single crystalline layer 3 is in a range of 0.7 through 3 μm, the concentration of defects is further reduced.

FIG. 1(*c*) shows that the warping of sapphire substrate 1 disappears. By adjusting the composition and thickness of the AlGaN single crystalline layer 3 in the respective above-mentioned ranges, the sapphire substrate 1 can be warped so as to be slightly concave (FIG. 1(*b*)). For example, as in the semiconductor lasers, the element characteristics will be improved if the sapphire substrate 1 is warped so as to be slightly concave.

As described above, the inventor has uniquely recognized that formation of the AlN and AlGaN single crystalline layers 2 and 3 in this order on the sapphire substrate 1 serves to reduce a warp on the sapphire substrate 1. This allows crystal growth on a large-region substrate to thereby improve productivity and/or yield. The inventor also has found that this reduces unnecessary stresses in the AlN and AlGaN single crystalline layers 2 and 3 to improve their crystal quality and the crystal quality of a nitride semiconductor layer formed on the AlGaN single crystalline layer 3 to thereby provide an element having improved characteristics.

Respective embodiments of the present invention will be described next based on the results of the above experiments. The first and second embodiments involve semiconductor lasers. The third and fourth embodiments deal with optical switches. The fifth-eighth embodiments involve field effect transistors. The making method will be described in the first and eighth embodiments.

(First Embodiment)

Figure 2:
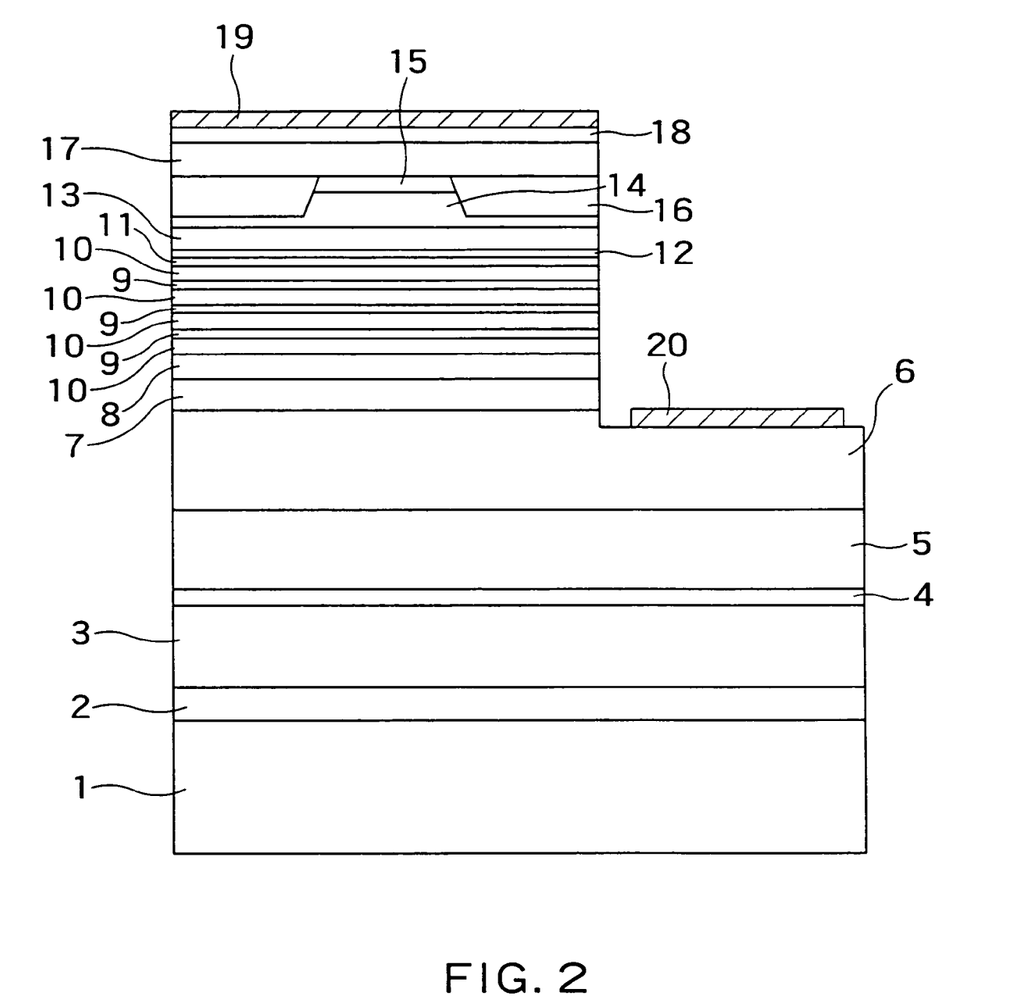
FIG. 2 is a schematic cross-sectional view of a nitride compound semiconductor element as a first embodiment of the present invention.

FIG. 2 is a schematic cross-sectional view of a nitride compound semiconductor element as a first embodiment of the present invention. The nitride compound semiconductor element of FIG. 2 is a nitride semiconductor laser that emits a blue light. It has a width of about 500 μm. It is obtained by sequentially forming on an AlGaN single crystalline layer 3 of FIG. 1(*c*) a single crystalline AlN protective layer 4 and an device structure section of layers 5–18 and then dividing the sapphire substrate and other layers formed on the sapphire substrate into elements. For convenience of explanation, the thicknesses and widths of the respective layers are illustrated on appropriately different scales.

The element of FIG. 2 comprises a sapphire substrate 1, a first single crystalline layer 2 of AlN formed on a c-surface of the sapphire substrate and a second single crystalline layer 3. The first single crystalline layer 2 is doped with carbon having a concentration of equal to or more than $3\times10^{18}$ cm$^{-3}$ and equal to or less than $1\times10^{20}$ cm$^{-3}$, and has a thickness of equal to or more than 10 nm and equal to or less than 50 nm. The second single crystalline layer 3 is made of $Al_{0.9}Ga_{0.1}N$ and has a thickness of 1.5 µm. A single crystalline AlN protective layer 4 is formed directly on the second single crystalline layer 3. The single crystalline AlN protective layer 4 prevents Ga atoms from evaporating from said second single crystalline layer 3 in crystal growth to thereby protect the second single crystalline layer 3, and the single crystalline AlN protective layer has a thickness of equal to or more than 1 nm and equal to or less than 10 nm.

An device structure section of layers 5–18 is formed on the single crystalline AlN protective layer 4. The device structure section of layers 5–18 has a similar structure to that of a general nitride semiconductor laser. Thus, their crystal growth is achieved, using a crystal forming apparatus similar to that used in the manufacture of the general nitride semiconductor lasers without performing any special processes. In the device structure section of layers 5–18, an electric current is injected through p-side and n-side electrodes 19 and 20 into a well layer 9, which emits a blue laser beam. The structure of the device structure section of layers 5–18 and the electrodes 19, 20 will be briefly described next. Sequentially formed on the AlN protective layer 4 are the GaN lattice modification layer 5 having a thickness of 3 µm, n-type GaN contact layer 6 having a thickness of 1 µm, n-type AlGaN clad layer 7 having a thickness of 1.3 µm, first optical waveguide 8 of an n-type GaN, an MQW active layer consisting of alternate $Ga_{0.8}In_{0.2}N$ well layers 9 and $Ga_{0.98}In_{0.02}N$ barrier layers 10, $Ga_{0.98}In_{0.02}N$-GaN graded layer 11, p-type $Al_{0.2}Ga_{0.8}N$ electron barrier layer 12, an $Al_{0.2}Ga_{0.8}N$ graded layer (not shown), second optical waveguide 13 of p-type GaN, and p-type $Al_{0.07}Ga_{0.93}N$ clad layer 14 having a stripe-shaped ridge. The P-type intermediate GaN contact layer 15 is formed on the ridge of the p-type clad layer 14. As shown in FIG. 2, n-type $Al_{0.2}Ga_{0.8}N$ current blocking layer 16 is formed on each side of the p-type GaN intermediate contact layer 15 and the ridge of the p-type clad layer 14. Sequentially formed on the current blocking layer 16 and intermediate contact layer 15 are the p-type GaN current diffusion layer 17 and p-type GaN contact layer 18. The p-side electrode 19 of Pd (having a thickness of 0.05 µm)/Pt (having a thickness of 1.0 µm) is attached to the p-type GaN contact layer 18. The n-side electrode 20 of Ti (having a thickness of 5 µm)/Al (having a thickness of 1.0 µm) is attached to the n-type GaN contact layer 6.

One of the features of the FIG. 2 semiconductor laser is that the first single crystalline layer 2 of AlN having high carbon concentration is formed on the sapphire substrate 1 and the second single crystalline layer 3 of $Al_{0.9}Ga_{0.1}N$ having a thickness of 1.5 µm is formed on the first single crystalline layer 2. This structure reduces residual stresses in the nitride compound semiconductor layers 2–17 and reduces threading dislocations in the active layers 9,10 to thereby provide a laser having improved characteristics. It also reduces a possible warp in substrate 1 (FIG. 1(c)) to thereby allow crystal growth on a large region substrate and improve productivity and/or yield.

In the semiconductor laser of FIG. 2 the first and second single crystalline layers 2 and 3 are formed, which reduces the number of lattice defects and/or residual stresses to thereby form a clad layer 7 having a flatter-surface. This also provides the well layer 9 of $Ga_{1-z}In_zN$ having a high In mole fraction z in a range of 0.15 through 0.30 to thereby realize a semiconductor laser that emits a light beam having a long wavelength and requires a reduced threshold current. Of course, the well layer 9 may be made of $Ga_{1-z}In_zN$ ($0 \leq z \leq 0.30$).

In contrast, the conventional nitride semiconductor laser has a problem that InN having larger lattice constant than GaN will be segregated from GaInN well layer 9, due to lattice defects and stress of underlying layer. Thus, the $Ga_{1-z}In_zN$ well layer having a In mole fraction z more than 0.15 is difficult to obtain and hence a blue light semiconductor lasers having improved characteristics are difficult to obtain.

Ranges of the composition and thickness of the second single crystalline layer 3 will be discussed next. In the nitride compound semiconductor laser of FIG. 2, the Al mole fraction x of the second single crystalline layer 3 made of $Al_xGa_{1-x}N$ is 0.9, and the thickness is made 1.5 µm. These values may be replaced with other values, and the ranges of those values will be described next with reference to FIGS. 3 and 4.

Figure 3:
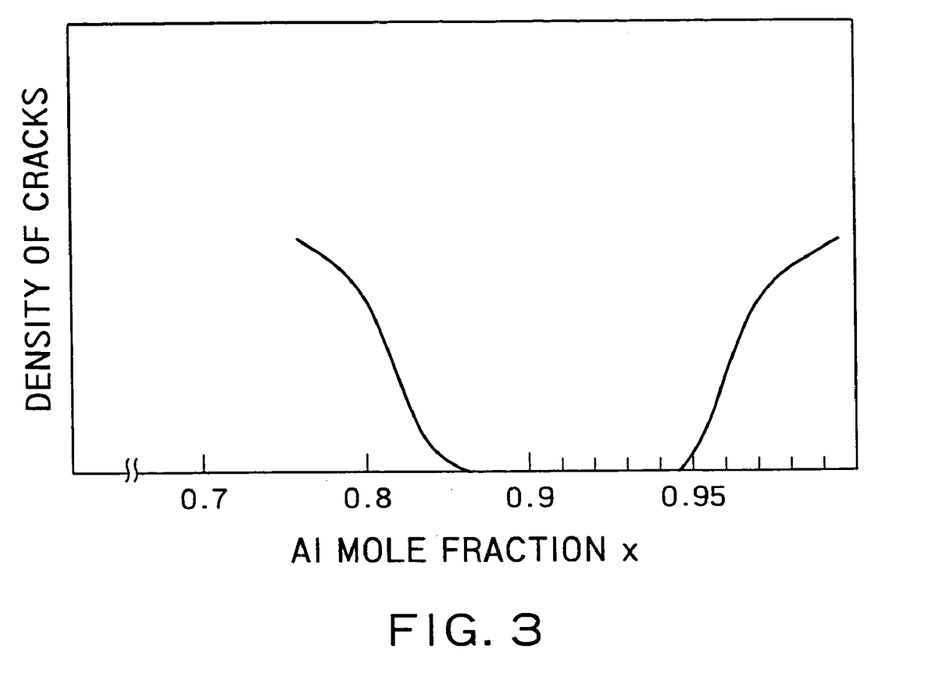
FIG. 3 illustrates the relationship between Al mole fraction x of a second single crystalline layer of the nitride compound semiconductor element of the first embodiment and density of cracks that occurred in active layers 9 and 10 of the nitride compound semiconductor element.

FIG. 3 shows a relationship between Al mole fraction x of the second single crystalline layer 3 of the FIG. 2 laser and density of cracks produced in its active layers 9 and 10. The second single crystalline layer 3 has a thickness of 1.5 µm in this case. It will be seen in FIG. 3 that few cracks are produced as long as the Al mole fraction of the second single crystalline layer 3 is in a range of 0.85 through 0.95. It will be also seen that if the Al mole fraction is less than 0.8 or more than 0.97, the crack density will increase extremely. It also will be seen that as a result the Al mole fraction x of the second single crystalline layer 3 should be in a range of 0.80 through 0.97, and preferably, 0.85 through 0.95.

Figure 4:
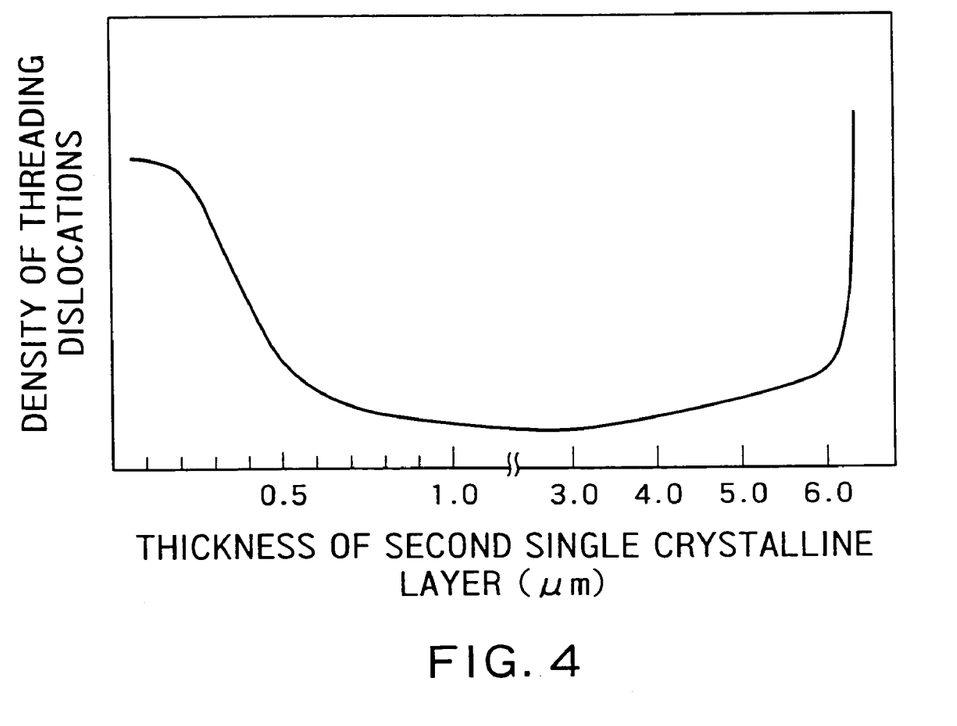
FIG. 4 illustrates the relationship between thickness of the second single crystalline layer 3 of the nitride compound semiconductor element of the first embodiment and density of threading dislocations that occurred in the active layers 9 and 10.

FIG. 4 shows a relationship between thickness of the second single crystalline layer 3 and density of threading dislocations in the active layers 9 and 10. It will be seen in FIG. 4 that if the thickness of the second single crystalline layer 3 is less than 0.7 µm, the number of threading dislocations starts to increase and that if the thickness of the second single crystalline layer 3 is less than 0.3 µm, the dislocations reducing effect is substantially nulled. It will also be known that if the thickness is more than 3.0 µm, the dislocations density increases due to production of microcracks and that if the thickness is more than 6.0 µm, the number of threading dislocations increases extremely due to production of the macrocracks. It is found according to the inventor's experiments that when the thickness of the second single crystalline layers 3 is in a range of 1.0 through 2 µm, good crystals could be grown reproducibly on the second single crystalline layers 3. It will also be seen that as a result the thickness of the second single crystalline layer 3 should be in a range of 0.3 through 6.0 µm, preferably 0.7 through 3.0 µm, and more preferably 1.0 through 2.0 µm.

In the nitride semiconductor laser of FIG. 2 described above, the doping densities and thicknesses of the layers 5–18 can be changed as required. In the following, specified examples of the respective layers will be shown.

The Si densities of the GaN lattice modification layer 5, n-type GaN contact layer 6 and n-type AlGaN clad layer 7 may be $2\times10^{18}$, $3\times10^{18}$ and $3\times10^{18}$ cm$^{-3}$, respectively.

The first optical waveguide layer 8 formed on the n-type AlGaN clad layer 7 may be made of n-type GaN that has a Si concentration of $1\times10^{18}$ cm$^{-3}$ and a thickness of 1.3 µm.

The active layers 9 and 10 formed on the first optical waveguide 8 may include three $Ga_{0.8}In_{0.2}N$ well layers (each having a Si concentration of $5\times10^{18}$ cm$^{-3}$ and a thickness of 2.5 nm) and three $Ga_{0.98}In_{0.02}N$ barrier layers (each having a thickness of 5 nm), respectively, superimposed alternately, i.e., to form a 3-cyclical multilayered structure. Each In mole fraction of the $Ga_{0.8}In_{0.2}N$ well layer 9 should be higher than that of $Ga_{0.98}In_{0.02}N$ barrier layer 10 to thereby provide a reduced band gap, which causes the quantum effect that confines electrons to improve the light emission efficiency.

In the $Ga_{0.98}In_{0.02}N$—GaN graded layer 11 formed on the active layers, the In mole fraction can be reduced gradually from the side of the active layers 9 and 10. The thickness of the layer 11 may be 20 nm.

The p-type $Al_{0.2}Ga_{0.8}N$ electron barrier layer 12 formed on the $Ga_{0.98}In_{0.02}N$—GaN graded layer 11 may have a Mg concentration of $5\times10^{18}$ cm$^{-3}$ and a thickness of 20 nm.

The $Al_{0.2}Ga_{0.8}N$—GaN graded layer (not shown) formed on the p-type $Al_{0.2}Ga_{0.8}N$ electron barrier layer 12 may have a Mg concentration of $5\times10^{18}$ cm$^{-3}$ and the Al mole fraction may decrease gradually from the side of the p-type $Al_{0.2}Ga_{0.8}N$ electron barrier layer 12. The $Al_{0.2}Ga_{0.8}N$—GaN graded layer may have a thickness of 20 nm.

The second optical waveguide layer 13 formed on the $Al_{0.2}Ga_{0.8}N$—GaN graded layer may be made of p-type GaN having a Mg concentration of $5\times10^{18}$ cm$^3$ and a thickness of 0.1 µm.

The p-type $Al_{0.07}Ga_{0.93}N$ clad layer 14 formed on the second optical waveguide layer 13 may have a Mg concentration of $1\times10^{18}$ cm$^{-3}$ and a thickness of 0.7 µm. The p-type. $Al_{0.07}Ga_{0.93}N$ clad layer 14 has a stripe-shaped ridge that has a width in a range of 1.5 through 3 µm and a thinned region formed by etching on each side of the ridge.

The p-type GaN intermediate contact layer 15 formed on the ridge of the p-type $Al_{0.07}Ga_{0.93}N$ clad layer 14 may have a Mg concentration of $2\times10^{19}$ cm$^3$ and a thickness of 0.2 µm.

The n-type $Al_{0.2}Ga_{0.8}N$ current blocking layer 16 is formed on each side of the ridge of the p-type $Al_{0.07}Ga_{0.93}N$ clad layer 14. The current blocking layer 16 may have a Si concentration of $2\times10^{19}$ cm$^{-3}$ and a thickness of 0.5 µm. This structure that has arranged the current blocking layer 16 around the ridge serves to control a transverse mode.

The p-type GaN current diffusion layer 17 formed on the n-type $Al_{0.2}Ga_{0.8}N$ current blocking layer 16 and the p-type GaN intermediate contact layer 15 may have a Mg concentration of $1\times10^{19}$ cm$^{-3}$ and a thickness of 0.4 µm.

The p-type GaN contact layer 18 formed on the p-type GaN current diffusion layer 17 may have a Mg concentration of $3\times10^{19}$ cm$^{-3}$ and a thickness of 0.05 µm.

The method of making the respective layers mentioned above will be next described briefly:

First, successively grown on the sapphire substrate 1 are the first single crystalline layer 2, second single crystalline layer 3, single crystalline AlN protective layer 4, GaN alleviating layer 5, GaN contact layer 6, AlGaN clad layer 7, GaN optical waveguide layer 8, GaInN well layer 9, GaInN barrier layer 10, GaInN—GaN graded layer 11, AlGaN electron barrier layer 12, GaN optical waveguide layer 13, AlGaN clad layer 14 and GaN intermediate contact layer 15.

Then, the GaN intermediate contact layer 15 and AlGaN clad layer 14 are shaped by reactive ion etching so as to provide the ridge. Then, the $Al_{0.2}Ga_{0.8}N$ current blocking layer 16 is grown, and the $Al_{0.2}Ga_{0.8}N$ current blocking layer 16 is etched until the p-type GaN intermediate contact layer 15 is exposed.

The p-type GaN current diffusion layer 17 and the p-type GaN contact layer 18 are then grown. In this crystal growth, the p-type GaN intermediate contact layer 15 plays a roll of protecting the surface of the AlGaN clad layer 14. The Al mole fraction of the AlGaN clad layer 14 may be reduced so as to reduce resistance to a current between the AlGaN clad layer 14 and the AlGaN clad layer 15 as required.

(Second Embodiment)

Figure 5:
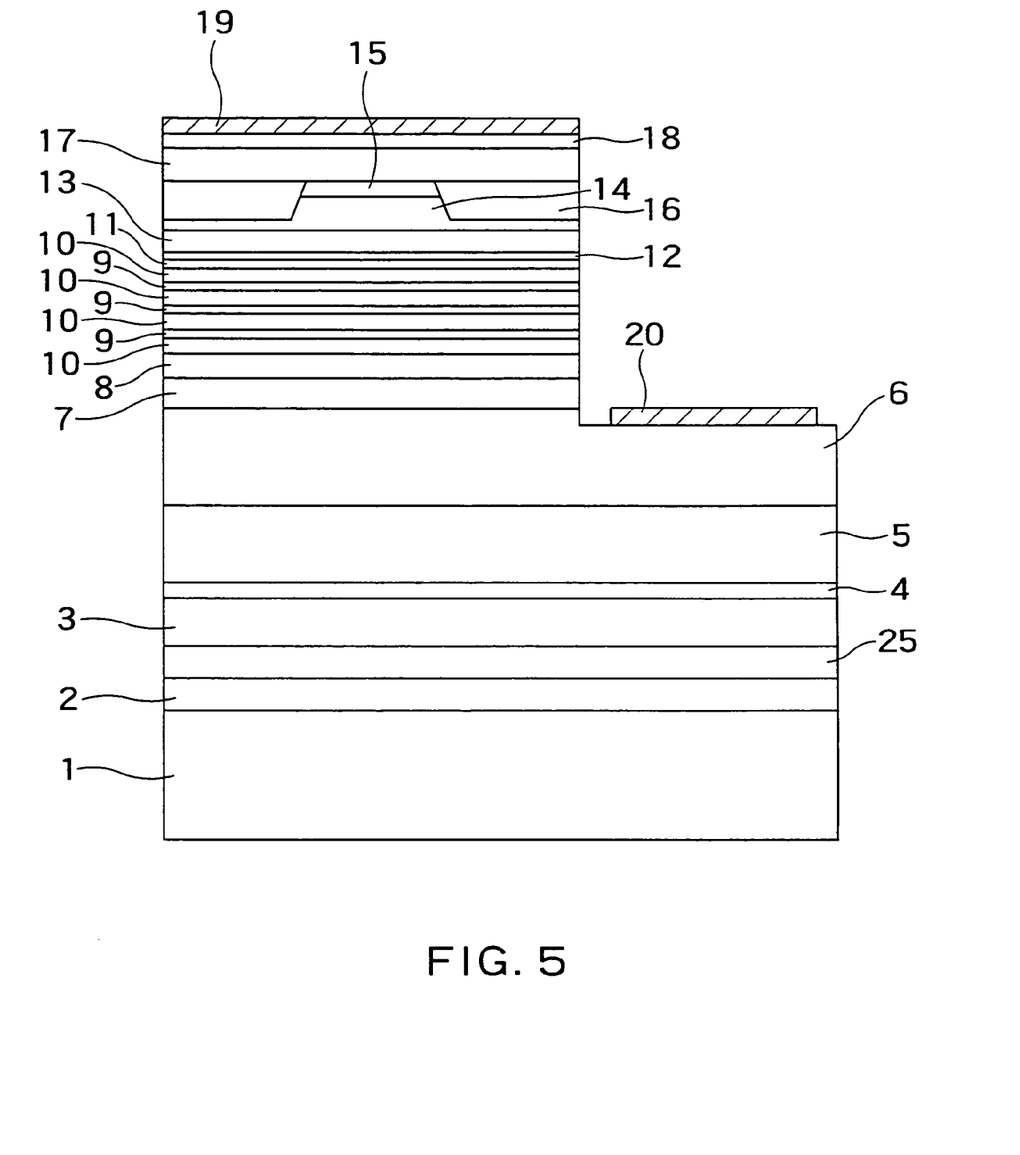
FIG. 5 is a schematic cross-sectional view of a nitride compound semiconductor element as a second embodiment of the present invention.

As shown in FIG. 5, a nitride compound semiconductor element of the second embodiment is different from the first embodiment in that an AlN layer (high-purity AlN layer) 25 is formed between a first single crystalline layer 2 of AlN and a second single crystalline layer 3 of AlGaN. The AlN layer 25 is made of AlN, containing no impurity or containing impurity having a concentration of less than $3\times10^{18}$ Cm-3. Preferably, the AlN layer 0.25 is made of high purity AlN, containing no impurity or containing impurity having a concentration of equal to or less than $1\times10^{16}$ cm$^{-3}$. The remaining structure of the second embodiment is similar to that of the first embodiment and further description thereof will be omitted. Provision of such AlN layer 25 further improves the flatness of the underlying layers of the second single crystalline layer 3 as well as yield and/or characteristics.

(Third Embodiment)

Figure 6:
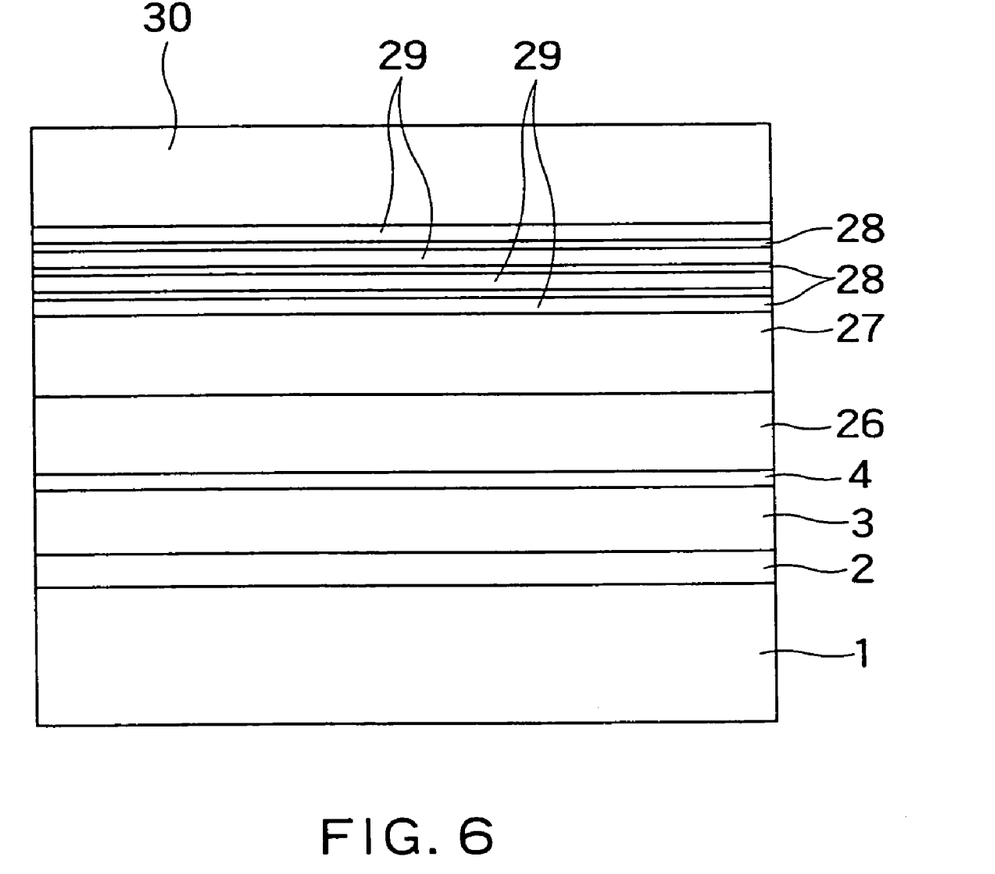
FIG. 6 is a schematic cross-sectional view of a nitride compound semiconductor element as a third embodiment of the present invention.

A nitride compound semiconductor element of the third embodiment is an optical switch shown in FIG. 6. One of the features of the optical switch is that a first single crystalline layer 2 and a second single crystalline layer 3 are formed in this order on a sapphire substrate 1 and an AlGaN lattice modification layer 26 is then formed over the layer 3. This realizes a heterojunction of a GaN well layer 28 and an AlN barrier layer 29 between which there is a great difference in band energy to thereby realize a very high speed switch.

More particularly, FIG. 6 is a schematic cross-sectional view of the optical switch of the third embodiment. As in the first embodiment (FIG. 2), the first single crystalline layer 2, second single crystalline layer 3, and single crystalline AlN protective layer 4 are formed sequentially on a c-surface of the sapphire substrate 1. The lattice modification layer 26 of $Al_{0.5}Ga_{0.5}N$ having a thickness of 1 µm is formed on the single crystalline AlN protective layer 4. The lattice modification layer 26 has a Si concentration of $2\times10^{18}$ cm$^{-3}$. A device structure section of layers 27–30 is formed on the lattice modification layer 26. The structure of the device structure section of layers 27–30 will be briefly described as follows: Formed on the lattice modification layer 26 is a multilayered-structural layer 27 of AlN and GaN. The AlN layer has a Si concentration of $5\times10^{18}$ cm$^{-3}$ and a thickness of 3 nm. The GaN layer has a thickness of 1.5 nm. The multilayered-structural layer 27 includes 30 cyclic layers of alternate AlN and GaN. On the multilayered-structural layer 27, a multiquantum well layer of alternate GaN well layer 28 and AlN barrier layer 29 is formed on the multilayered-structural layer 27. On the multiquantum well layer, an AlN confining layer 30 is formed.

One of the features of the optical switch of FIG. 6 is that the first single crystalline layer 2, the second single crystalline layer 3, and the lattice modification layer 26 of $Al_{0.5}Ga_{0.5}N$ having a thickness of 1 µm are formed in this order on the sapphire substrate 1. This structure further modifies lattice stresses in the crystal and realizes a heterojunction of the AlN barrier layer 29 and GaN well layer 28.

There is a difference of large band energy between AlN and GaN. Thus, formation of a quantum well structure of AlN barrier layer 29 and GaN well layer 28 provides a large quantum effect to thereby realize an element having a very high performance. This optical switch can be used as a very high speed switch using the quantum effect at a wavelength of 1.5 µm useful for optical communication.

In contrast, it has been considered in the past that a heterojunction of AlN barrier layer 29 and GaN well layer 28 is very difficult to make because there is a large lattice constant difference of 2.4% between AlN and GaN, which will produce a three-dimensional growth to thereby make it impossible to form a flat heterointerface. However, according to the inventor's experiments, the heterojunction has been achieved by modifying the stresses.

The composition and thickness of the lattice modification layer 26 of $Al_yGa_{1-y}N$ of the optical switch of FIG. 6 will be discussed. While the Al mole fraction z of the layer 26 is made 0.5 and its thickness 1.0 µm, these value may be changed to other ones.

First, a range of the Al mole fraction z will be discussed. The inventor examined, using an AFM the relationship between Al mole fraction of the AlGaN lattice modification layer 26 and growing state of a layered structure of alternate AlN and GaN growing on the alleviating layer 26. A result of the examination will be shown next:

(1) When the Al mole fraction y of the $Al_yGa_{1-y}N$ lattice modification layer 26 is 0, the AlN barrier layer 29 and the GaN well layer 28 exhibit a three- and a two-dimensional growth, respectively;

(2) When the Al mole fraction y of the $Al_yGa_{1-y}N$ lattice modification layer 26 is 0.25, the AlN barrier layer 29 and the GaN well layer 28 each exhibit a two-dimensional growth;

(3) When the Al mole fraction y of the $Al_yGa_{1-y}N$ lattice modification layer 26 is 0.3, the AlN barrier layer 29 and the GaN well layer 28 each exhibit a two-dimensional growth likewise;

(4) When the Al mole fraction y of the $Al_yGa_{1-y}N$ lattice modification layer 26 is 0.5, the AlN barrier layer 29 and the GaN well layer 28 each exhibit a two-dimensional growth likewise;

(5) When the Al mole fraction y of the $Al_yGa_{1-y}N$ lattice modification layer 26 is 0.7, the AlN barrier layer 29 and the GaN well layer 28 each exhibit a two-dimensional growth likewise.

(6) When the Al mole fraction y of the $Al_yGa_{1-y}N$ lattice modification layer 26 is 0.75, the AlN barrier layer 29 and the GaN well layer 28 each exhibit a two-dimensional growth likewise; and (7) When the Al mole fraction y of the $Al_yGa_{1-y}N$ lattice modification layer 26 is 1.0, the AlN barrier layer 29 and the GaN well layer 28 exhibit a two-dimensional growth and a three-dimensional growth, respectively.

It is seen as a result of the examination by the AFM that when the Al mole fraction y of $Al_yGa_{1-y}N$ lattice modification layer 26 is in a range of 0.25 through 0.75, AlN and GaN are growable flat at atom level to thereby provide a good effect. It is found in the present invention that examination of a relationship between Al mole fraction y of the $Al_yGa_{1-y}N$ lattice modification layer 26 and warp on the sapphire substrate 1 due to lattice mismatch clarified that the warp on the sapphire substrate 1 is almost eliminated when the Al mole fraction y is in a range of 0.3 through 0.7. As a result, it is also seen that when the Al mole fraction y of the $Al_yGa_{1-y}N$ lattice modification layer 26 is in a range of 0.3 through 0.7, productivity and/or yield are improved. It will be seen from these results that the Al mole fraction y of the $Al_yGa_{1-y}N$ lattice modification layer 26 should be in a range of 0.25 through 0.75, preferably, 0.3 through 0.7.

A range of the thickness of the $Al_yGa_{1-y}N$ lattice modification layer 26 will be examined. According to the inventor's experiments, it is found that when the $Al_yGa_{1-y}N$ lattice modification layer 26 has an excessively thin thickness, it could not have a flat surface, and should have a thickness of at least 0.3 µm for flattening purposes. In order to prevent occurrence of cracks in this semiconductor element due to residual stresses, the modification layer 26 should have a thickness of not more than 5 µm. And in order to prevent occurrence of cracks reproducibly, it is seen that the modification layers should have a thickness of not more than 3 µm. It will also be seen from these results that the thickness of the $Al_yGa_{1-y}N$ lattice modification layer 26 should have a thickness in a range of 0.3 through 5 µm, preferably 0.3 through 3 µm.

While the well layer 28 of the FIG. 6 optical switch described above is illustrated as being made of GaN, it may be made of GaInN instead.

(Fourth Embodiment)

Figure 7:
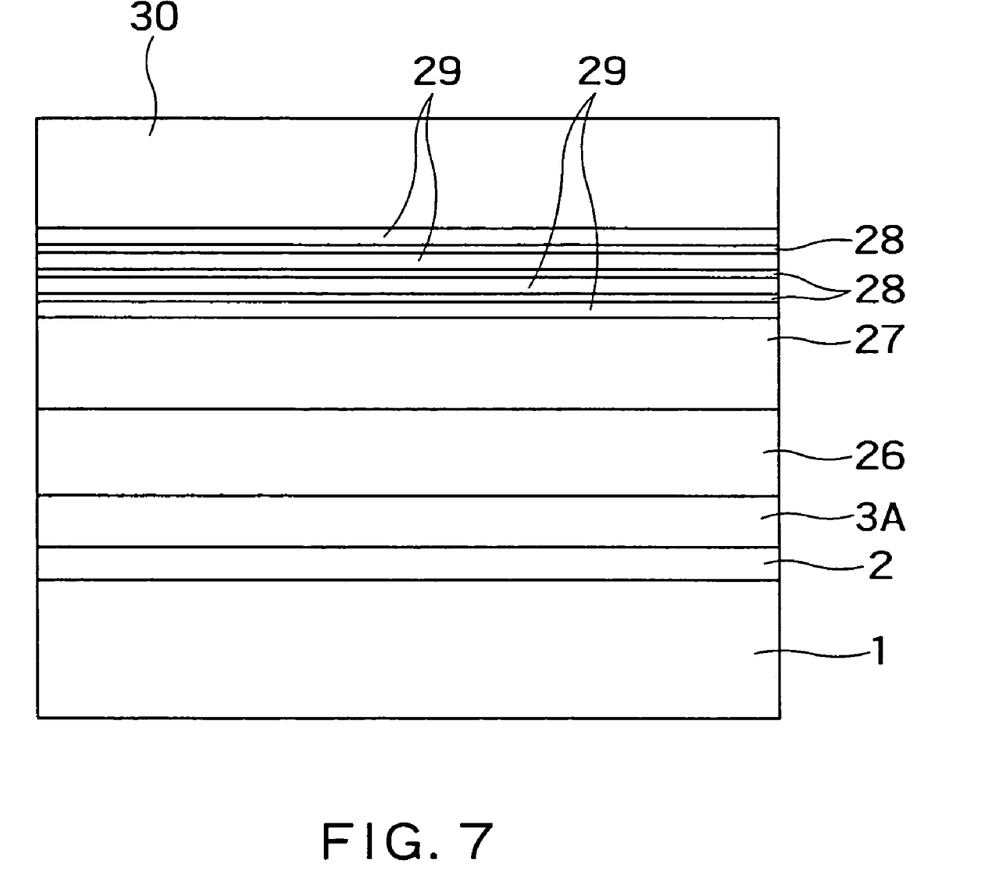
FIG. 7 is a schematic cross-sectional view of a nitride compound semiconductor element as a fourth embodiment of the present invention.

As shown in FIG. 7, a nitride compound semiconductor element of the fourth embodiment directed to an optical switch is different from that of the third embodiment (FIG. 6) in that a layer such as the single crystalline AlN protective layer 4 is not formed, and a second single crystalline layer 3A is formed of AlN in stead of AlGaN. The remaining structure of the fourth embodiment is similar to that of the third embodiment and further description thereof will be omitted.

The optical switch of FIG. 7 comprises a sapphire substrate 1, a first single crystalline layer 2 of AlN formed on the sapphire substrate 1, a lattice modification layer 26 formed on the first single crystalline layer, the lattice modification layer 26 being made of $Al_yGa_{1-y}N(0.25 \leq y \leq 0.75)$ and having a thickness of equal to or more than 0.3 µm and equal to or less than 3 µm, and an device structure section 27–30 of a nitride semiconductor formed on the lattice modification layer 26, the device structure section 27–30 having a heterojunction of an AlN layer and a GaN layer. The optical switch of FIG. 7 further comprises a second single crystalline layer 3A of AlN formed between the first single crystalline layer 2 and the lattice modification layer 26, the second single crystalline layer 3A having a thickness of equal to or more than 0.3 µm and equal to or less than 6 µm.

The optical switch of FIG. 7 is useful when a small substrate is used. That is, when the second single crystalline layer 3A is made of AlN, it has the same AlN material as the first single crystalline layer 2 to thereby simplify the manufacturing process on the other hand, when the second single crystalline layer 3A is made of AlN, the effect of reducing a warp of the sapphire substrate 1 is diminished. So, if a large substrate is used, the substrate will be largely warped to thereby reduce the yield. But, when a small substrate is used, the warp produced on the substrate is very small and does not substantially become a problem.

(Fifth Embodiment)

Figure 8:
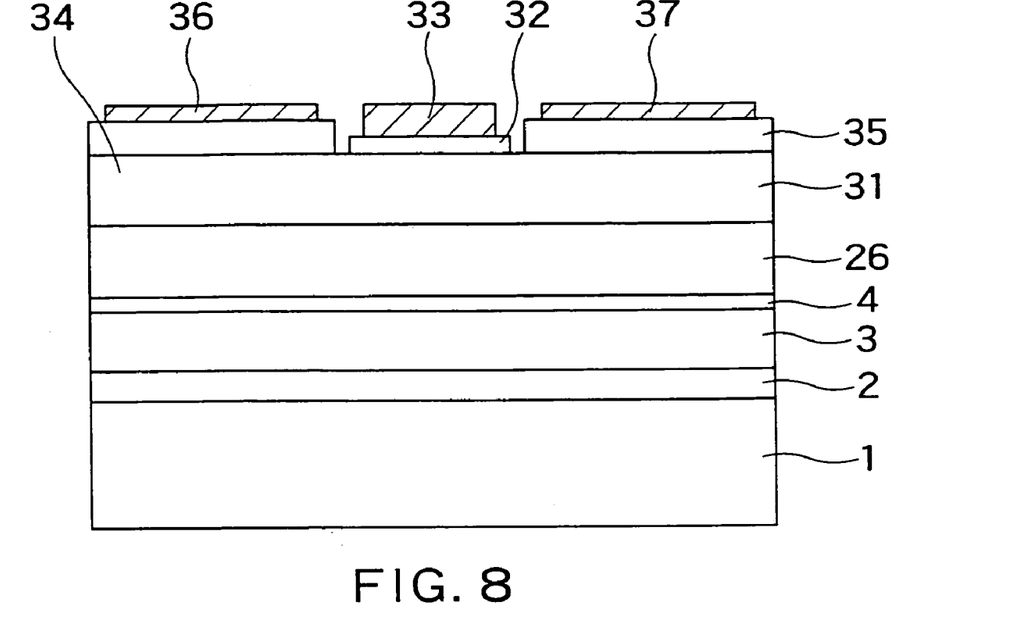
FIG. 8 is a schematic cross-sectional view of a nitride compound semiconductor element as a fifth embodiment of the present invention.

As shown in FIG. 8, a nitride compound semiconductor element of the fifth embodiment is directed to a field effect transistor, which includes a sapphire substrate 1, a first single crystalline layer 2, a second single crystalline layer 3, an AlN protective layer 4 and a lattice modification layer 26, similar to those of the third embodiment (FIG. 6).

More particularly, FIG. 8 is a schematic cross-sectional view of the field effect transistor of the fifth embodiment. The element of FIG. 8 comprises a sapphire substrate 1, a first single crystalline layer 2 of AlN formed on the sapphire substrate 1 and having a thickness in a range of 10 through 50 nm, a second single crystalline layer 3 of $Al_xGa_{1-x}N$ ($0.8 \leq x \leq 0.97$) formed on the first single crystalline layer 3 and having a thickness in a range of 0.3 through 6 µm, a single crystalline AlN protective layer 4 formed on the second single crystalline layer 3 and having a thickness in a range of 1 through 10 nm, the single crystalline AlN protective layer 4 prevents Ga atoms from dropping from the second single crystalline layer 3 in crystal growth to thereby protect the second single crystalline layer 3, and a lattice modification layer 26 of $Al_yGa_{1-y}N$ ($0.25 \leq y \leq 0.75$) formed on the single crystalline AlN protective layer 4 and having a thickness in a range of 0.3 through 3 µm.

Formed on the lattice modification layer 26 is a device structure section the structure of which is as follows. A channel layer 31 of high-purity GaN having a thickness in a range of 1.5 through 10 nm is formed on the lattice modification layer 26. Formed on the channel layer 31, as shown in FIG. 7, regionn AlN or Si-doped AlN layer 32 having a thickness in a range of 1 through 10 nm, a Si-doped GaN layer 34, and a Si-doped GaN layer 35. Gate, source and drain electrodes 33, 36 and 37 of Ti/Pt are formed on the AlN, GaN and GaN layers 32, 34 and 35, respectively.

The transistor of FIG. 7 includes the first and second single crystalline layers 2 and 3 and lattice modification layer 26 formed on the sapphire substrate 1, which provides an element having improved characteristics without unnecessary stresses involved. It also reduces a warp on the substrate 1 and improves productivity and/or yield.

In order to confine electrons effectively to within the GaN layer 31 which will be a quantum well in the field effect transistor of FIG. 7, the AlN layer 32 is preferably thicker than the GaN layer 31. The Al mole fraction y of the $Al_yGa_{1-y}N$ lattice modification layer 26 is preferably in a range of 0.3 through 0.5 in order to reduce stresses in the channel layer 31.

(Sixth Embodiment)

Figure 9:
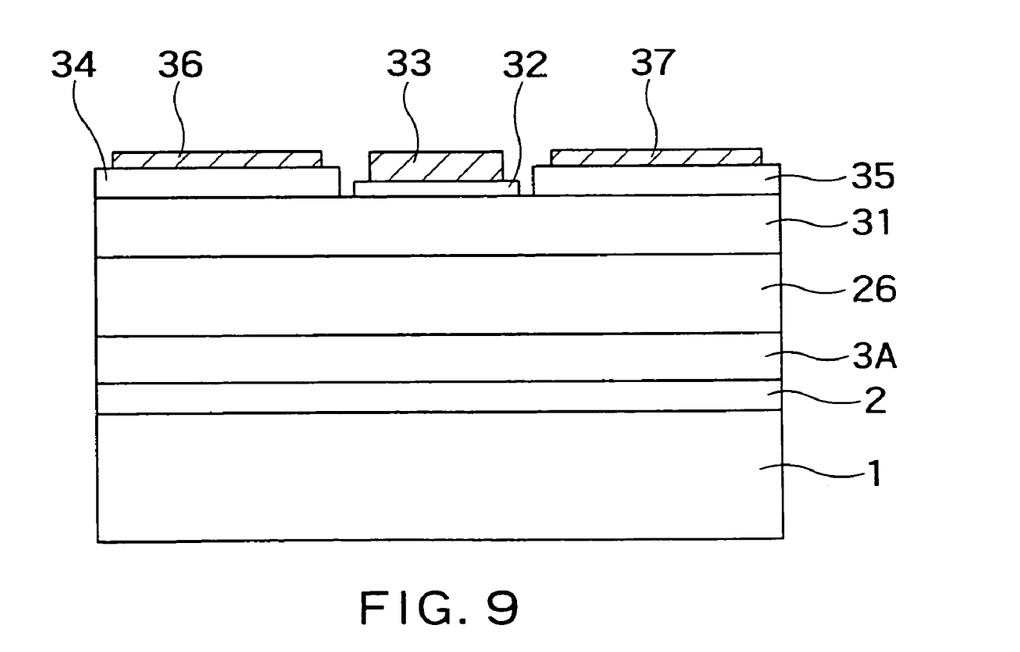
FIG. 9 is a schematic cross-sectional view of a nitride compound semiconductor element as a sixth embodiment of the present invention.

As shown in FIG. 9, the sixth embodiment is also directed to a field effect transistor which is different from the fifth embodiment (FIG. 8) in that a layer such as the single crystalline AlN protective layer 4 is not formed and that a second single crystalline layer 3A is made of AlN. The remainder of the present embodiment is similar to that of the fifth embodiment and further description thereof sill be omitted.

The field effect transistor of FIG. 9 is useful when a small substrate is used as in the fourth embodiment (FIG. 7).

(Seventh Embodiment)

Figure 10:
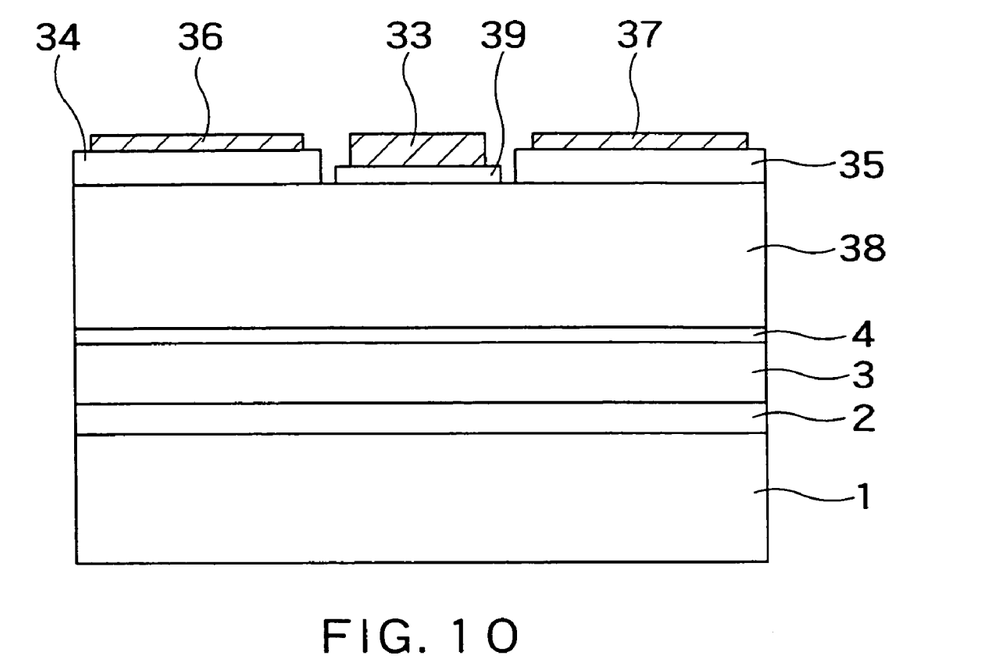
FIG. 10 is a schematic cross-sectional view of a nitride compound semiconductor element as a seventh embodiment of the present invention.

The seventh embodiment is likewise directed to a field effect transistor, which, as will be seen in FIG. 10, is different from that of the fifth embodiment (FIG. 8) in that a the lattice modification layer 26 is not used, and that a gate insulating film is made of $Al_{1-b}In_bN$ ($0.03 \leq b \leq 0.10$). The structure of the sapphire substrate 1, the first single crystalline layer 2, the second single crystalline layer 3 and the single crystalline AlN protective layer 4 is similar to that of each of the fifth, third and first embodiments (FIGS. 8, 6, and 1).

FIG. 10 is a schematic cross-sectional view of the field effect transistor of the seventh embodiment. Formed on a c-surface of the sapphire substrate 1 are the first single crystalline layer 2 of AlN having high carbon concentration, second single crystalline layer 3 of $Al_xGa_{1-x}N$ ($0.8 \leq x \leq 0.97$) and single crystalline AlN protective layer 4. Formed on the single crystalline AlN protective layer 4 is a FET (Field Effect Transistor) device structure section. The FET device structure section has a channel layer 38, a source electrode 36 electrically connected to the channel layer 38, a drain electrode 37 electrically connected to the channel layer 38, and a gate electrode 33 formed over a first part of the channel layer 38 via a gate insulating film 39 made of $Al_{1-b}In_bN$ ($0.03 \leq b \leq 0.10$). The channel layer 38 channels carrier, the source layer is a source of the carrier, and the drain layer is a drain of the carrier. The gate electrode 33 is formed between the source electrode 36 and the drain electrode 37. The channel layer 38 is formed of high-resistance GaN to which carbon is added and having a thickness in a range of 2 through 4 µm. The source electrode 36 is formed over a second part of the channel layer 38 via a Si-doped first GaN (nitride compound semiconductor) layer 34. The drain electrode 37 is formed over a third part of said channel layer 38 via a Si-doped second GaN (nitride compound semiconductor) layer 35. The gate electrode 33 is made of Ti/Pt, and the source and drain electrodes 36 and 37 are made of Ti/Al.

One of the features of the field effect transistor of FIG. 10 is that the gate insulating film formed on the channel layer 38 is made of $Al_{1-b}In_bN$. It is found according to the inventor's experiments that when the In mole fraction b is in a range of 0.03 through 0.10, the characteristics of the transistor were improved. While in the past the crystal growth of $Al_{1-b}In_bN$ ($0.03 \leq b \leq 0.10$) is considered to be very difficult, residual stresses in the first and second single crystalline layers 2 and 3 are greatly modified in the element of FIG. 1 to thereby allow the crystal growth.

(Eight Embodiment)

Figure 11:
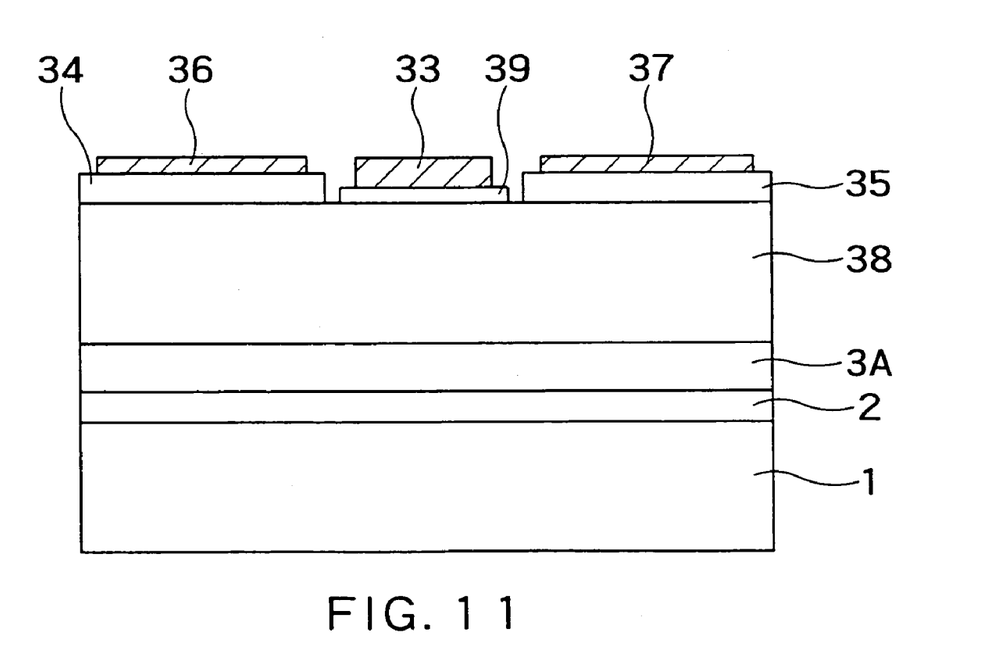
FIG. 11 is a schematic cross-sectional view of a nitride compound semiconductor element as an eighth embodiment of the present invention.

The eighth embodiment is also directed to a field effect transistor, which is different from that of the seventh embodiment (FIG. 10) in that as shown in FIG. 11, a layer such as the single crystalline AlN protective layer 4 is not provided and a second single crystalline layer 3A is made of AlN. The remaining structure of the eighth embodiment is similar to that of the fifth embodiment and further description thereof will be omitted.

Like the fourth embodiment (FIG. 7), the field effect transistor of FIG. 11 is useful when a small substrate is used. That is, when the second single crystalline layer 3A is made of AlN, it has the same AlN material as the first single crystalline layer 2 to thereby simplify the manufacturing process. On the other hand, when the second single crystalline layer 3A is made of AlN, the effect of reducing a warp of the sapphire substrate 1 is diminished. So, if a large substrate is used, the substrate will be largely warped to thereby reduce the yield. But, when a small substrate is used, the warp produced on the substrate is very small and does not substantially become a problem.

In the field effect transistor of FIG. 11, the second single crystalline layer 3A may be made of $Al_xGa_{1-x}N$ ($0.97 \leq x \leq 1$). Even when the second single crystalline layer 3A is made of $Al_xGa_{1-x}N$ ($0.97 \leq x \leq 1$), a reduction in the yield and/or productivity is prevented because the field effect transistor is different from the semiconductor laser (FIGS. 2 and 5) in that the device structure section has a thin thickness and that there are few problems of a warp on the substrate 1. Of course, like the field effect transistor of FIG. 10, the second single crystalline layer 3A may be made of $Al_xGa_{1-x}N$ ($0.80 \leq x \leq 0.97$). Also, according to the inventor's experiments, when Al mole fraction x is more than 0.85, more preferable results is obtained. It will be seen that as a result the Al mole fraction x of the second single crystalline layer 3 or 3A shown in FIG. 11 or FIG. 10 should be in a range of 0.80 through 1.0, and preferably, 0.85 through 1.0.

From the above, the field effect transistors of FIGS. 11 and 10 can be recognized as comprising the sapphire substrates 1, the first single crystalline layers 2 of AlN formed on the sapphire substrate 1, the second single crystalline layer 3 or 3A formed on the first single crystalline layer 2, the second single crystalline layer being made of $Al_xGa_{1-x}N$ ($0.80 \leq x \leq 1$), and device structure sections formed on the second single crystalline layers 3 or 3A.

A method of growing the respective nitride layers of the nitride compound semiconductor elements shown in the respective embodiments will be described next. Epitaxial growth is carried out using low-pressure MOCVD. One of the features of the method of forming the nitride compound semiconductor element of each embodiment is to form the first single crystalline layer 2 with materials of Groups V and III at a predetermined ratio at a high temperature in a range of 1050 through 1200° C.

First, the sapphire substrate 1 is placed on a heater (susceptor). [A high-purity hydrogen is then introduced from a gas tube at 20 liters per minute into regionctive chamber to therby replace the air within the chamber with the hydrogen. Then, a gas exhaust line is connected to a rotary pump, to reduce and set the internal pressure within the chamber to a pressure in a range of 7400 through 23000 Pa. Then, the sapphire substrate 1 is heated to a temperature in a range of 1050 through 1200° C. and a part of the high-purity hydrogen is replaced with a $NH_3$ gas as a material of Group-V.

Next, as will be seen in FIG. 6, an Al compound organic metal such as $Al(CH_3)_3$ or $Al(C_2H_5)_3$ as a Group-III material is then introduced into the reactive chamber to thereby cause it to grow so as to become the first single crystalline layer 2 of AlN having a thickness in a range of 5 through 50 nm. In order to make uniform the crystal orientations of single crystal of the first single crystalline layer 2, control of a ratio in feed of the Groups V material to the Group III material is important. Also, in order to cause a high-quality film to grow, it is required that a ratio in feed of Group-material to Group-material is in a range of 0.7 through 50. Also, in order to obtain a satisfactory quality reproducibly, a ratio in feed of Group-V material to Group-material is preferably in a range of 1.2 through 3.0.

Next, as will be seen in FIG. 6, the sapphire substrate 1 is heated to a temperature in a range of 1250 through 1350° C., and a Ga compound organic metal such as $Ga(CH_3)_3$ or $Ga(C_2H_5)_3$ as the Group-III material is additionally introduced into the reactive chamber to thereby cause a second single crystalline layer 3 of AlGaN to grow so as to have a thickness in a range of 0.3 through 6 μm. At this time, when the AlN layer 25 is to be formed as shown in FIG. 5, the AlN layer 25 is caused to grow under the same conditions as the second buffer layer 3 without additionally introducing any Ga compound organic metal into the reactive chamber.

Next, as will be seen in FIG. 6, the sapphire substrate 1 is then set to a temperature in a range of 1100 through 1250° C. to form the AlGaN lattice modification layer 26, as required.

Next, a nitride semiconductor layer that will be an device structure section is then formed on the AlGaN lattice modification layer 26. When a layer containing In, for example InGaN layer 9 of FIG. 2, is to be formed, an In compound organic metal such as $In(CH_3)_3$ or $In(C_2H_5)_3$ may be used as an In material. When an n-type layer, for example the layers 6–8 of FIG. 2, is to be formed, Si hydride such as $SiH_4$ or a Si compound organic metal such as $Si(CH_3)_4$ may be used as n-type dopants. When p-type layers, for example, the layers 17 and 18 of FIG. 2, are to be formed, Mg compound organic metal such as $Cp_2Mg$ or $m\text{-}Cp_2Mg$ may be used as p-type dopants. In order to increase the activation ratio of the p-type dopants, a method of eliminating hydrogen that has entered into the grown layers by heat treatment at about 800° C. may be used. Alternatively, the p-type layer may be grown at a large ratio in feed of Group-V material to Group-III material to stop the occurrence of N-atom defects to thereby prevent deactivation by hydrogen. This method prevents deterioration in the crystal quality due to heat treatment to thereby form a p-type layer having improved characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nitride compound semiconductor element comprising:
   a sapphire substrate;
   a first single crystalline layer of AlN formed on said sapphire substrate;
   a second single crystalline layer formed on said first single crystalline layer, said second single crystalline layer being made of $Al_xGa_{1-x}N$ ($0.85 \leq x \leq 0.95$) and having a thickness of equal to or more than 0.7 μm and equal to or less than 3 μm; and
   a device structure section of a nitride compound semiconductor formed on said second single crystalline layer,
   wherein said first single crystalline layer is doped with carbon having a concentration of equal to or more than $3 \times 10^{18}$ cm$^{-3}$ and equal to or less than $1 \times 10^{20}$ cm$^{-3}$.

2. The nitride compound semiconductor element according to claim 1, wherein said sapphire substrate either has no warp or is warped concavely toward said device structure section.

3. The nitride compound semiconductor element according to claim 1, further comprising:
   a single crystalline AlN protective layer formed directly on said second single crystalline layer for preventing Ga atoms from evaporating from said second single crystalline layer to thereby protect said second single crystalline layer, said AlN protective layer having a thickness of equal to or more than 1 nm and equal to or less than 10 nm.

4. The nitride compound semiconductor element according to claim 1, further comprising:
   an AlN layer formed between said first single crystalline layer and said second single crystalline layer, said AlN layer containing no impurity or containing impurity having a concentration of less than $3 \times 10^{18}$ cm$^{-3}$.

5. A method of making a nitride compound semiconductor element, the method comprising
   providing a sapphire substrate;
   depositing on the sapphire substrate a first single crystalline layer of AlN; depositing on the first single crystalline layer a second single crystalline layer of $Al_xGa_{1-x}N$ ($0.85 \leq x \leq 0.95$) having a thickness of equal to or more than 0.7 μm and equal to or less than 3 μm;

depositing on the second single crystalline layer a device structure section of a nitride compound semiconductor; and producing the semiconductor element of claim 1.

6. The nitride compound semiconductor element according to claim 1, wherein said nitride compound semiconductor element comprises a semiconductor laser.

7. The nitride compound semiconductor element according to claim 1, wherein said first single crystalline layer of AlN has a thickness of equal to or more than 10 nm and equal to or less than 50 nm.

8. The nitride compound semiconductor element according to claim 1, wherein said nitride compound semiconductor element comprises a semiconductor laser and wherein said device structure section comprises:

a first conductive-type semiconductor layer;

an active layer formed on said first conductive-type semiconductor layer for emitting light by current injection; and a second conductive-type semiconductor layer formed on said active layer.

9. The nitride compound semiconductor element according to claim 8, wherein said active layer contains a well layer made of $Ga_{1-z}In_zN$ ($0.15 \leq z\ 0.3$).

10. The nitride compound semiconductor element according to claim 1, further comprising:

a lattice modification layer formed between said second single crystalline layer and said device structure section, said lattice modification layer being made of $Al_yGa_{1-y}N$ ($0.25 \leq y \leq 0.75$) and having a thickness of equal to or more than 0.3 μm and equal to or less than 3 μm.

11. The nitride compound semiconductor element according to claim 10, wherein said nitride compound semiconductor element comprises an optical switch or a field effect transistor.

12. The nitride compound semiconductor element according to claim 10, wherein said device structure section has a heterojunction of an AlN layer and a GaN layer.

13. The nitride compound semiconductor element according to claim 12, wherein said nitride compound semiconductor element comprises an optical switch.

* * * * *